(12) United States Patent
Kristjansson et al.

(10) Patent No.: US 10,944,274 B2
(45) Date of Patent: Mar. 9, 2021

(54) IDEAL DIODE FUNCTION IMPLEMENTED WITH EXISTING BATTERY PROTECTION FETS

(71) Applicant: Microsoft Technology Licensing, LLC, Redmond, WA (US)

(72) Inventors: Stefan Jon Kristjansson, Kirkland, WA (US); Algird Michael Gudaitis, Fall City, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 402 days.

(21) Appl. No.: 15/875,412

(22) Filed: Jan. 19, 2018

(65) Prior Publication Data

US 2019/0229543 A1    Jul. 25, 2019

(51) Int. Cl.
*H02J 7/00* (2006.01)
*G06F 1/26* (2006.01)
(Continued)

(52) U.S. Cl.
CPC .......... *H02J 7/0026* (2013.01); *G01R 31/379* (2019.01); *G06F 1/263* (2013.01);
(Continued)

(58) Field of Classification Search
CPC ...... H02J 7/0026; H02J 7/0021; H02J 7/0022; H02J 7/0019; H02J 7/0072; H02J 7/00714;
(Continued)

(56) References Cited

U.S. PATENT DOCUMENTS

| 5,517,379 A | 5/1996 | Williams et al. |
|---|---|---|
| 7,528,578 B2 | 5/2009 | Tamai et al. |

(Continued)

FOREIGN PATENT DOCUMENTS

| CN | 201364940 Y | 12/2009 |
|---|---|---|
| CN | 201466157 U | 5/2010 |

(Continued)

OTHER PUBLICATIONS

"Active OR-ing Solution with LM74610-Q1 Smart Diode Controller", Retrieved From: http://www.ti.com/lit/an/snva747b/snva747b.pdf, Oct. 2015, 12 Pages.

(Continued)

*Primary Examiner* — Zixuan Zhou
(74) *Attorney, Agent, or Firm* — Ray Quinney & Nebeker P.C.; Paul N. Taylor

(57) ABSTRACT

The present disclosure relates to apparatuses and methods of providing an ideal diode function to a battery having a protective field effect transistor (FET). An apparatus may include the protective FET configured to selectively connect an external voltage to a battery for charging the battery. The apparatus may also include a controller coupled with a gate of the protective FET via a node and configured to enable the protective FET. The apparatus may further include an override circuit coupled to the node and configured to selectively draw current away from the gate of the protective FET based on the external voltage or to interrupt the path from a controller to a protective FET. The override circuit of the apparatus may provide protection from cross-charging of the battery by a second battery while using the protective FET that is already used for charge/discharge protection.

18 Claims, 5 Drawing Sheets

500

↓ 502
selectively coupling, by a protective FET, an external voltage to a battery for charging the battery ↓ 504
enabling, by a controller coupled with a gate of the protective FET via a node, the protective FET ↓ 506
based on the external voltage, selectively overriding the controller, by an override circuit coupled to the nodes, by drawing current away from the gate of the protective FET or by opening the path between the controller and the gate of the protective FET

(51) Int. Cl.
*G06F 1/28* (2006.01)
*H02J 7/34* (2006.01)
*G01R 31/379* (2019.01)

(52) U.S. Cl.
CPC .............. *G06F 1/28* (2013.01); *H02J 7/0019* (2013.01); *H02J 7/0021* (2013.01); *H02J 7/0022* (2013.01); *H02J 7/0029* (2013.01); *H02J 7/0072* (2013.01); *H02J 7/00308* (2020.01); *H02J 7/00714* (2020.01); *H02J 7/342* (2020.01); *H02J 7/0024* (2013.01)

(58) Field of Classification Search
CPC ...... H02J 7/342; H02J 7/0029; H02J 7/00308; G06F 1/263; G06F 1/28; G01R 31/379
USPC .................................................. 320/103, 134
See application file for complete search history.

(56) References Cited

U.S. PATENT DOCUMENTS

| | | | |
|---|---|---|---|
| 7,855,531 B2 | 12/2010 | Zhang | |
| 8,698,457 B2 | 4/2014 | Hogari et al. | |
| 2009/0278501 A1* | 11/2009 | Ho | H02J 7/0031 |
| | | | 320/134 |
| 2011/0169455 A1 | 7/2011 | Nagase | |
| 2014/0022000 A1* | 1/2014 | Ribarich | H03K 17/04126 |
| | | | 327/377 |
| 2015/0311735 A1* | 10/2015 | Shimada | H02H 7/18 |
| | | | 320/107 |
| 2016/0149421 A1 | 5/2016 | White et al. | |

FOREIGN PATENT DOCUMENTS

| | | |
|---|---|---|
| WO | 2009099659 A2 | 8/2009 |
| WO | 2017027589 A1 | 2/2017 |

OTHER PUBLICATIONS

"International Search Report and Written Opinion Issued in PCT Application No. PCT/US2018/068095", dated Apr. 17, 2019, 15 Pages.
"LTC4110 Battery Backup System Manager", Retreived From <<https://web.archive.org/web/20130606055821/http:/cds.linear.com/docs/en/datasheet/4110fb.pdf>>, Jun. 6, 2013, pp. 1-52.
"MOSFETs for Lithium-ion Battery Protection", Retreived From <<https://industrial.panasonic.com/kr/products/semiconductors/mosfets/lithiumionmosfet>>, Retreived on: Nov. 10, 2017, 2 Pages.
Jackson, Bill, "Battery Circuit Architecture", Retrieved From <<https://web.archive.org/web/20111125142041/http:/www.ti.com/lit/ml/slyp087/slyp087.pdf>>, Nov. 25, 2011, 9 Pages.

* cited by examiner

IDEAL DIODE FUNCTION IMPLEMENTED WITH EXISTING BATTERY PROTECTION FETS

BACKGROUND

Technical Field

The present disclosure relates generally to battery systems, and more particularly, to an ideal diode circuit for a battery system having multiple batteries.

Introduction

Electronics designers may be tasked with designing electronic devices that have specific power requirements. Sometimes these devices do not have a single space sufficient for a single battery that meets the power requirements of the device. Instead, designers may use multiple batteries within multiple spaces of a device in order to meet the power requirements. The use of multiple batteries introduces issues into a battery system. For example, when multiple batteries are first installed, the batteries may be at different states of charge and therefore may or may not be at the same voltage. As another example, interconnect resistances from each of the batteries to loads and/or chargers means that the batteries are unlikely to match each other in voltage at all operating times as one battery may discharge/charge faster or slower than another battery. A solution to these issues may include direct parallel connection of the batteries. However, connecting the batteries in parallel may lead to cross-charging such that one battery attempts to charge another battery so that the batteries are at the same voltage. Cross-charging may waste power and may potentially damage the batteries.

Accordingly, more efficient systems and methods for connecting batteries in parallel are needed to provide battery protection and prevent cross-charging.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A device with multiple batteries may allow the device to retain a form factor requirement and a load requirement that may be prevented by a device having a single battery. Further, with appropriate support circuits, multiple batteries also allow optimal charging of each battery, when charged independently. However, when multiple batteries are used by a device, voltage differences between the batteries may cause one of the batteries to cross-charge another one of the batteries. Voltage differences may be due to numerous conditions such as initial state of charges of the batteries being different, or individual charge/discharge circumstances of the batteries due to different resistances of the interconnects coupled with the batteries. Cross-charging may waste power and may potentially damage the batteries as cross-charging is typically performed in an uncontrolled manner.

One solution to preventing cross charging includes the use of a diode function. However, the use of standard diodes introduces voltage and power losses into a battery system. Further, typical "ideal diodes," which are used to mimic the protective advantages of a standard diode without the voltage and power losses of a standard diode, introduce additional field effect transistors (FETs) into the battery system which may take up valuable space in a device and may add more voltage and power losses.

Aspects of the present disclosure are presented to overcome the deficiencies of standard diodes and ideal diodes used by battery systems. In an example, some battery systems powered by rechargeable batteries, such as lithium ion batteries, require battery protection circuitry which is usually implemented with protective FETs driven by a control chip. The present disclosure overcomes the deficiencies of the standard diodes and ideal diodes used in a battery system by using the existing protection FETs in a battery system for the purposes of an "ideal diode" function. Use of the protection FETs in the "ideal diode" function, according to aspects of the present disclosure, may eliminate additional power and voltage losses that may be unavoidable if other components are added in a discharge path between a battery and a system load. Further, use of the protection FETs in the "ideal diode" function, according to aspects of the present disclosure, prevents the standard battery protection features required by battery standards from being circumvented.

In aspects of the disclosure, methods and apparatuses are provided. An apparatus may include a protective FET configured to selectively connect an external voltage to a battery for charging the battery; a controller coupled with a gate of the protective FET via a node and configured to enable the protective FET; and an override circuit coupled to the node and configured to selectively draw current away from the gate of the protective FET based on the external voltage.

In an aspect of the disclosure, a method of providing an ideal diode function to a battery having a protective FET is provided. The method may include selectively connecting, by the protective FET, an external voltage to a battery for charging the battery; enabling, by a controller coupled with a gate of the protective FET via a node, the protective FET; and selectively overriding, by an override circuit coupled to the node, the controller by drawing current away from the gate of the protective FET based on the external voltage.

In another aspect, an apparatus may include a protective FET configured to selectively connect an external voltage to a battery for charging the battery; a controller having a charge line coupled with a gate of the protective FET and configured to enable the protective FET; a switch coupled between the charge line of the controller and the gate of the protective FET; and a first comparator having an output coupled to the switch and configured to toggle the switch to interrupt the current from the controller to the gate of the protective FET when the external voltage is greater than the voltage of the battery.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illus

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details. Additionally, the term "component" as used herein may be one of the parts that make up a system, may be hardware, firmware, and/or software stored on a computer-readable medium, and may be divided into other components.

In the following description, for purposes of explanation the term "about" is used in this disclosure means a nominal value or variation of 1%, 2%, 3%, 4%, 5%, and 10%, for example. Further, while values (e.g., resistance and capacitance values) are provided for some examples of the disclosure, these values are only provided as illustrations for understanding the present disclosure and in no way limit the present disclosure as other values may be used depending on the application of the implementations provided below.

The present disclosure generally relates to battery systems, and more particularly, to an ideal diode circuit for a battery system having multiple batteries.

Additional features of the present aspects are described in more detail below with respect to FIGS. 1-5.

Figure 1:
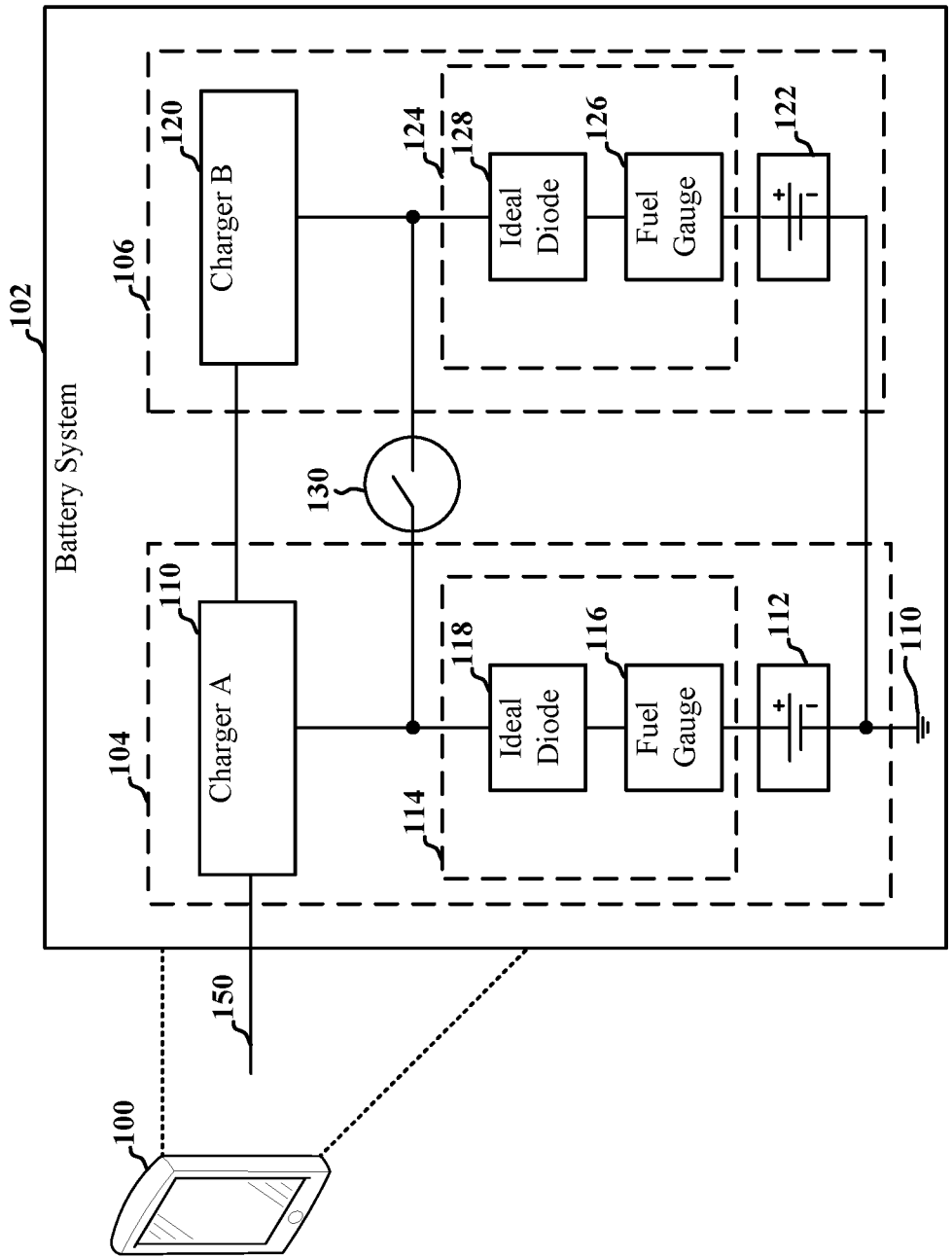
- FIG. 1 is a block diagram of a device having a battery system according to various implementations of the present disclosure.

FIG. 1 is a block diagram of a device 100 having a battery system 102 according to implementations of the present application. Examples of the device 100 may include a cellular phone, a smart phone, a personal digital assistant (PDA), a handheld device, a tablet computer, a laptop computer, a cordless phone, a wearable device, a smart watch, an entertainment device, or any device having a need for multiple batteries.

The battery system 102 may be configured for providing power to components (not shown) such as one or more processors, memory/computer-readable memory, communication systems, and/or a display of the device 100. The battery system 102 may include subsystems such as a main subsystem 104 and a support subsystem 106 that are coupled in parallel. Having the multiple battery subsystems, for example, the main subsystem 104 and the support subsystem 106, in parallel may be beneficial to allow batteries to be physically spaced from each other due to limited space within the device 100. While the present disclosure describes two battery subsystems in parallel, one skilled in the art would recognize that more than two battery systems may also be used and that a device having two or more battery subsystems may benefit from implementing the aspects of the present application.

The main subsystem 104 may include a first charger 110 (charger "A") configured to receive power on an external source line 150 for charging the first battery 112. The main subsystem 104 may also include the first battery 112 and first protection circuit 114. The first battery 112 may be a rechargeable battery composed of lithium ion, nickel cadmium, nickel-metal hydride, lithium polymer, lead acid, or other rechargeable battery material. The first protection circuit 114 is configured to provide protective functions for the first battery 112 such as over-charge and over-discharge functions. The first protection circuit 114 may include switches (see e.g., 314, 316 of FIG. 3), a first fuel gauge 116, and a first ideal diode circuit 118 to provide protection for the first battery 112. The first fuel gauge 116 may be configured to determine a state of charge (SOC) of the first battery 112. The first fuel gauge 116 may also be configured to control other components of the first protection circuit 114, as described below, for determining when to toggle charging of the first battery 112. The first ideal diode circuit 118 is configured to prevent cross-charging of the first battery 112 from a second battery (e.g., second battery 122).

The support system 106 includes a second charger 120 (charger "B"), a second battery 122, a second protection circuit 124, and a second fuel gauge 126, and a second ideal diode circuit 128 which performs the same functions as the first charger 110, the first battery 112, the first protection circuit 114, the first fuel gauge 116, and the first ideal diode circuit 118, respectively. Accordingly, description of these components is omitted for brevity.

As shown by FIG. 1, the first battery 112 and the second battery 122 are connected in parallel whenever switch 130 is closed. The parallel connection of these batteries may be desired due to spatial and/or power requirements of a device, or any other design reason. However, a designer may not desire to have one battery cross-charge another battery. Cross-charging may occur due to a higher voltage of one of the batteries charging a lower voltage of another one of the batteries. To control cross-charging, designers typically keep batteries in parallel at the same SOC by using batteries of the same capacity and characteristics, which is not always possible (e.g., form factor constraints may force the need to use batteries with different capacity and characteristics). In some cases, a diode function may be desirable to connect batteries to the same system load but prevent cross-charging. However, a standard diode includes voltage and power losses, which may be significant enough to reduce run time of a battery and may require extra thermal management components and space in a device. Accordingly, ideal diode circuit may be used to perform the function of a diode. Ideal diodes may include extra diodes, integrated circuits, field-effect transistors (FETs), or other circuitry that may require additional circuit board area, higher costs, and additional power losses to the battery system.

Accordingly, the first ideal diode circuit 118 and the second ideal diode circuit 128 of the present disclosure are designed to implement the function of an ideal diode to prevent cross-charging by exerting additional control over FETs already required for battery protection of the first battery 112 and the second battery 122 without compromising safety aspects of the protection function.

Figure 2:
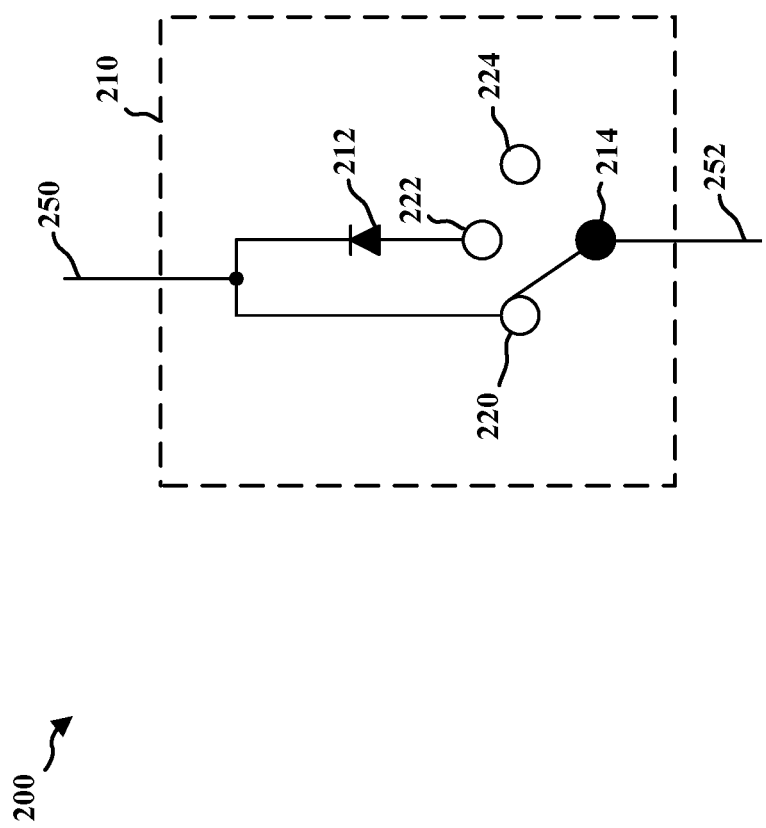
FIG. 2 is block diagram illustrating a simplified representation of functions performed by circuits of a battery system according to various implementations of the present disclosure.

FIG. 2 is block diagram 200 illustrating a simplified representation of functions performed by a protective circuit 210 of a battery system having a diode 212 according to various implementations of the present disclosure. These functions may be performed by the ideal diode circuit 118 and the fuel gauge controller 116 or the ideal diode circuit 128 and the fuel gauge controller 126, when configured according to an implementation of the present disclosure. The protective circuit 210 may include a system line 250 for connection with a load, a charger (e.g., the first charger 110), another battery (e.g., the second battery 122), and/or other circuitry. The ideal diode circuit 210 may also include a battery line 252 for connecting with a battery (e.g., the first battery 112). The protective circuit 210 may also include the diode 212 to prevent cross-charging by a second battery (e.g., the second battery 122).

As shown by FIG. 2, the protective circuit 210 may also include a switch 214 for switching between a first mode, a second mode, and a third mode. In the first mode, the switch 214 may connect to a first contact 220 such that normal battery protection functions of a fuel gauge/battery protection controller are in effect. In the first mode, both charging and discharging of a battery (e.g., the first battery 112) are allowed up to the protection limits (over-charge and over-discharge) enforced by a fuel gauge controller (e.g., the fuel gauge controller 116).

In the second mode, the switch 214 may connect to a second contact 222 such that charging of the battery (e.g., the first battery 112) is disallowed by the diode 212, even if the fuel gauge controller (e.g. the fuel gauge controller 116) does not determine that an over-charge condition exists. However, in the second mode, discharging of the battery (e.g., the first battery 112) may still occur. In the third mode, the switch 214 may connect to the third contact 224 such that the battery (e.g., the first battery 112) cannot be charged or discharged, regardless of whether an over-charge or over-discharge condition exists. Details of implementations of battery subsystems that may perform each of these functions are described below.

Figure 3:
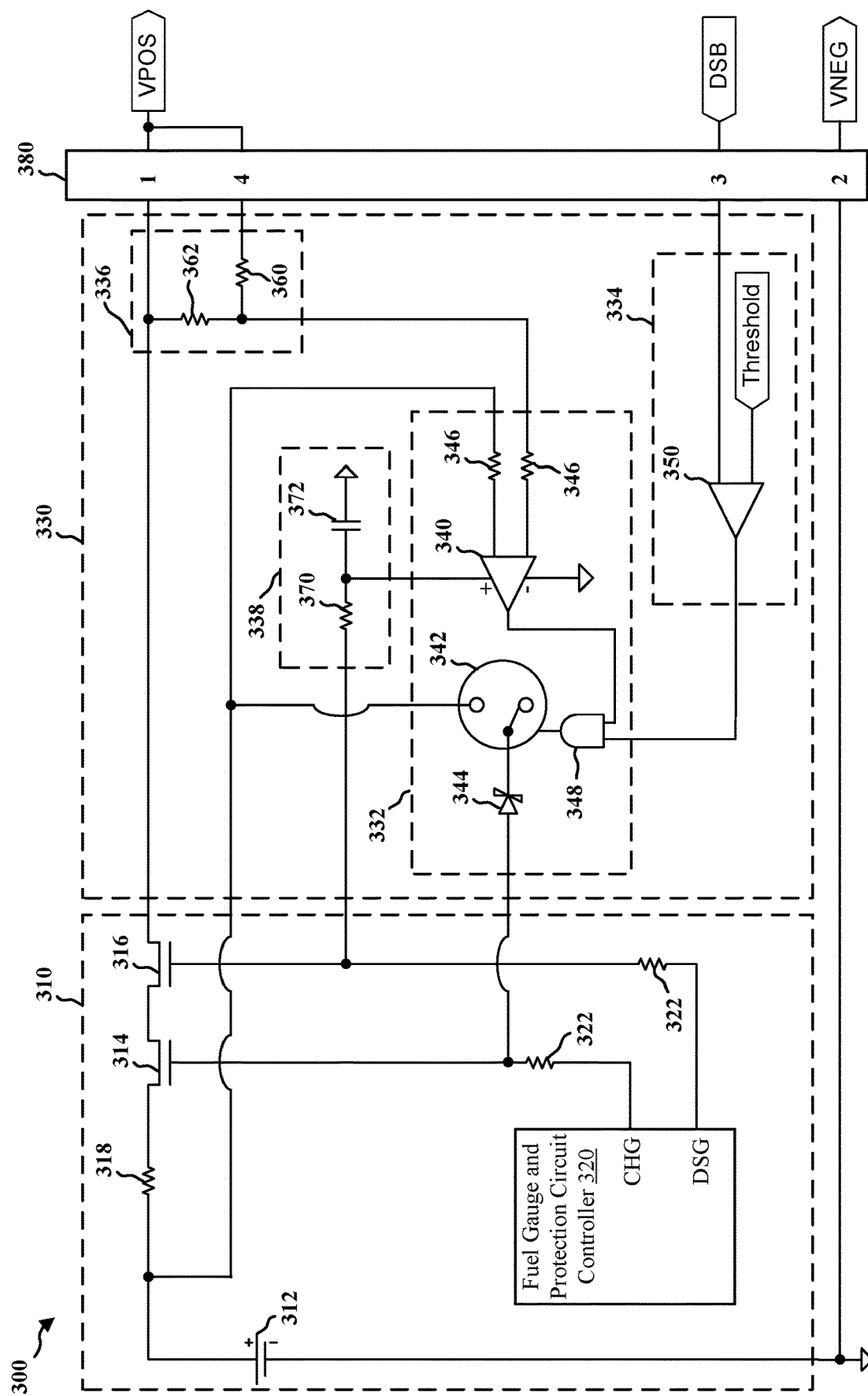
FIG. 3 is a block diagram of a first implementation of a battery system according to various implementations of the present disclosure.

FIG. 3 is a block diagram of a battery subsystem 300 which is a first implementation of a battery subsystem according to an implementation of the present disclosure. An example of the battery subsystem 300 may include the first battery 112 and the first protection circuit 114 or the second battery 122 and the second protection circuit 124 of FIG. 1. The battery subsystem 300 of FIG. 3 may include a battery and protective circuit 310 coupled with an ideal diode circuit 330. The battery and protective circuit 310 may include a battery 312, a first protective FET 314, a second protective FET 316, and a fuel gauge and protection circuit controller 320. The battery 312 may be configured to support a load of a device (e.g., device 100). As shown by FIG. 3, a positive connection of the battery 312 may couple with the load or system voltage VPOS via pin 1 of connector 380 and a negative connection of the battery 312 may couple with ground and/or device potential VNEG via pin 2 of connector 380. Examples of the battery 312 may include the first battery 112 or the second battery 122 of FIG. 1.

The first protective FET 314 and the second protective FET 316 may be configured to toggle a coupling between the battery 312 and system voltage VPOS. When the first and second protective FETs 314, 316 are closed, the battery 312 may couple to the system voltage VPOS. When the first and second protective FETs 314, 316 are open, the battery 312 cannot be charged or discharged as described above in the third mode of FIG. 2. While the present disclosure describes two protective FETs being used by the battery and protective circuit 310, those skilled in the art would recognize that any number of protective FETs, including one or more protective FETs, may be utilized by the battery and protective circuit 310.

In an example, the first and second protective FETs 314, 316 form a back-to-back series protection FET scheme. For example, a source of the first protective FET 314 may be coupled with the battery 312, a drain of the first protective FET 314 may be coupled with a drain of the second protective FET 316, and a gate of the first protective FET 314 may be coupled with a charge control line CHG of the fuel gauge and protection circuit controller 320. Further, a source of the second protective FET 316 may be coupled with the system line or load, a drain of the second protective FET 316 may be coupled with a drain of the first protective FET 314, and a gate of the second protective FET 316 may be coupled with a discharge control line DSG of the fuel gauge and protection circuit controller 320. The drain of the first protective FET 314 may be coupled with the drain of the second protective FET 316 to prevent leakage of battery 312 to the system and leakage of the system voltage VPOS to the battery 312. Examples of the first protective FET 314 and the second protective FET 316 may include n-channel FETs, however, one or more p-channel FETs may be used in other implementations.

The fuel gauge and protection circuit controller 320 may be configured as both a fuel gauge and a controller of the first and second protective FETs 314, 316. In an example, the fuel gauge and protection circuit controller 320 may determine an SOC of the battery 312 and, based on the SOC, control the first and second protective FETs 314, 316 to couple the battery 312 with the system voltage VPOS or decouple the battery 312 from the system voltage VPOS. In an example, the fuel gauge and protection circuit controller 320 may be a protection control module (PCM) circuit.

The battery and protective circuit 310 may also include resistors for assisting in monitoring of the battery and/or providing current protection for the different components. In some examples, the battery and protective circuit 310 may include a sense resistor 318 which may be coupled between the source of the first protective FET 314 and the positive connection of the battery 312 and may be configured for assisting other components in a battery system to monitor the current into or out of the battery 312. In an example, the sense resistor 318 may have a low resistance (e.g., about 5 mΩ). In some examples, the battery and protective circuit 310 may also include resistors 322 which may be configured to provide current protection for the fuel gauge and protection circuit controller 320 and the first protective FET 314 and the second protective FET 316. In some examples, each of the resistors 322 may have the same resistance value (e.g., about 10 kΩ). However, in other examples, the resistors 322 may have different resistance values.

The ideal diode circuit 330 is configured to prevent cross-charging of the battery 312 from a second battery. In an example, the ideal diode circuit 330 may include an override circuit 332 configured to monitor the voltage of the battery 312 and the system voltage VPOS and based on the monitored voltages, draw current away from the gate of the first protective FET 314 such that the first protective FET 314 is disabled and the battery 312 is not charged by a second battery.

The override circuit 332 may include a first comparator 340, a switch 342, a diode 344, resistors 346, and a logic gate 348. The first comparator 340 is configured to receive a first voltage associated with a voltage of the battery 312 on a first input and a second voltage associated with the system voltage VPOS on a second input. The first comparator 340 compares the first voltage with the second voltage to determine which of the voltages is greater. Based on the comparison, an output of the comparator controls the switch 342 to pull current from the gate of the first protective FET 314. For example, when the second voltage is greater than the first voltage, meaning that the system voltage VPOS is greater than the voltage of the battery 312, the output of the first comparator 340 goes high (e.g., logic "1"), otherwise the output of the first comparator 340 is low (e.g., logic "0").

The switch 342 is configured to enable or disable current from being drawn from the gate of the first protective FET 314. For example, the switch 342, when turned on, couples the gate of the first protective FET 314 with an equipotential such as the positive side of the battery 312. While FIG. 3 illustrates the switch 342 being configured to couple the gate of the first protective FET 314 with the positive side of the battery 312, those skilled in the art would understand that in other implementations the switch 342 may couple the first protective FET 314 with any equipotential (e.g., a power source other than the battery 312 or a voltage rail) or ground. When turned off, the switch 342 may open a coupling between the gate of the first protective FET 314 and the equipotential.

The diode 344 is configured to conduct current from the gate of the first protective FET 314 to the equipotential. The diode 344 may be coupled between the gate of the first protective FET 314 and the switch 342. The diode 344 may allow gate current coming from the charge control line CHG of the fuel gauge and protection circuit controller 320 to be drawn away from first protective FET 314 when the switch 342 is enabled. However, the diode 344 may also prevent current flow from the positive terminal of battery 312 to the charge control line CHG of the fuel gauge and protection circuit controller 320 if the switch 342 is turned on at the same time as the fuel gauge and protection circuit controller 320 is trying to turn off the first protective FET 314, thereby preventing draining of the battery 312 through the charge control line CHG of the fuel gauge and protection circuit controller 320.

The override circuit 332 may also include resistors 346 that may provide current protection and/or assistance for current or voltage measurement of the voltage of the battery 312 and the system voltage VPOS. The resistors 346 may be coupled with the first input and the second input of the first comparator 340, respectively. The resistors 346 may have the same resistance value (e.g., about 100 kΩ) or different resistance values.

In some examples, the override circuit 332 may also include a logic gate 348 to assist in controlling the switch 342. As illustrated by FIG. 3, the logic gate 348 may be an AND gate for controlling the switch 342. The logic gate 348 may receive the output of the first comparator 340 and an enable/disable signal, which may be a logic "1" to indicate that the override circuit 332 is enabled or may be a logic "0" to indicate that the override circuit 332 is disabled. In an example, the logic gate 348 controls the switch 342 to couple the gate of the first protective FET 314 with the equipotential when the enable/disable signal is a logic "1" and the first comparator 340 is high or a logic "1."

In some examples, the ideal diode circuit 330 may also include a disable circuit 334, which is configured to enable/disable the function of the ideal diode circuit 330. In other words, based on the disable circuit 334, the ideal diode circuit 330 performs the functions of the first and second modes of FIG. 2, as described above. In an example, the disable circuit 334 may be configured to disable the override circuit 332 such that the override circuit 332 is prevented from pulling current away from the gate of the first protective FET 314, which is similar to the first mode of FIG. 2 described above. In another example, the disable circuit 334 may be configured to enable the override circuit 332 such that the override circuit 332 may have some control over the first protective FET 314, which is similar to the second mode of FIG. 2 described above. In an example, the disable circuit 334 may include a second comparator 350 configured to receive a disable signal DSB from the device on pin 3 of the connector 380 and a threshold. Based on the comparison of the disable signal DSB and the threshold, the second comparator 350 may provide the enable/disable signal to the logic gate 348. In an example, the second comparator 350 may provide a logic "0" (i.e., disable) to the logic gate 348 when the disable signal DSB is greater than the threshold. In an example, the disable signal DSB may indicate that a charger (e.g., the first charger 110) is charging or desires to charge the battery 312.

In some examples, the ideal diode circuit 330 may also include an input circuit 336 configured to provide a primary input and a secondary input to the override circuit 332 via a primary resistor 360 and a secondary resistor 362. As shown by FIG. 3, the primary resistor 360 may provide system voltage VPOS to the first comparator 340. The primary resistor 360 may be coupled between pin 4 of the connector 380, which receives the system voltage VPOS, and the second input of the first comparator 340. The secondary resistor 362 is configured to prevent the inputs of ideal diode circuit 330 from floating. Floating may cause the ideal diode circuit 330 and the state of the first protective FET 314 to have an uncontrolled behavior. The secondary resistor 362 may provide a version of the system voltage VPOS to the first comparator 340 when a connection between the pin 4 of the connector 380 and VPOS is not properly connected. The secondary resistor 362 may be coupled between the pin 1 of the connector 380 and the second input of the first comparator 340. In an example, a resistance of the primary resistor 360 is less than a resistance of the secondary resistor 362. For example, the resistance of the secondary resistor 362 may be about 1 kΩ, and the resistance of the primary resistor 360 may be about 22Ω.

In some examples, the ideal diode circuit 330 may also include a stability circuit 338 configured to stabilize the override circuit 332. In an example, the stability circuit 338 may include a resistor 370 and a capacitor 372. The resistor 370 may be coupled with the gate of the second protective FET 316 and in series with the capacitor 372. The capacitor 372 may also couple with ground or equipotential. Further, a node between the resistor 370 and the capacitor 372 may connect to a positive supply line of the first comparator 340. In an example, the resistor 370 may have a resistance of about 47 kΩ and the capacitor 372 may have a capacitance of about 1000 pF.

Implementation

An example of an implementation of the battery and protective circuit 310 and the ideal diode circuit 330 in a battery system (e.g., 102) will now be described.

As shown by FIG. 3, the fuel gauge and protection circuit controller 320 is configured to control the first and second protective FETs 314, 316. The fuel gauge and protection circuit controller 320 may control the first and second protective FETs 314, 316 based on a SOC of the battery 312 and/or needs of a load coupled with the battery 312. In an example, the fuel gauge and protection circuit controller 320 may drive the gate of the first protective FET 314 high via the charge control line CHG such that the first protective FET 314 is enabled and the positive line of the battery 312 couples with the system voltage VPOS for charging the battery 312. In another example, the fuel gauge and protection circuit controller 320 may drive the gate of the second protective FET 316 high via the discharge control line DSG line such that the second protective FET 316 is enabled and the positive line of the battery 312 couples with the system voltage VPOS for discharging the battery 312 (e.g., battery 312 is coupled with a load). In another example, the fuel gauge and protection circuit controller 320 may drive the gates of both the first and second protective FETs 314, 316 high via the charge and discharge control lines CHG and DSG such that both the first and second protective FETs 314, 316 are enabled and the positive line of the battery 312 couples with the system voltage VPOS for more efficient charging or discharging of the battery 312 (e.g., battery 312 is coupled with a load or charger through the lowest resistance).

The first comparator 340 of the override circuit 332 may monitor the voltage at the battery 312. The second input of the first comparator 340 of the override circuit 332 may monitor the voltage of the system voltage VPOS based on the resistance of the resistor 360 or resistor 362. The first comparator 340 may compare the monitored voltages to determine if the system voltage VPOS is greater than the voltage of the battery 312. In an example, the system voltage VPOS may be greater than the voltage of the battery 312 when a second battery (e.g., the second battery 122) has a higher voltage than the battery 312.

When the system voltage VPOS is greater, the first comparator 340 may turn the switch 342 on to couple the gate of the first protective FET 314 with the equipotential (e.g., the positive side of the battery 312). In doing so, current, provided by the charge control line CHG of the fuel gauge and protection circuit controller 320 to the gate of the first protective FET 314, is drawn away from the first protective FET 314 and the first protective FET 314 may be disabled.

Further, when the first comparator 340 senses that the battery 312 is no longer trying to be charged by cross-charging (i.e., the system voltage VPOS is equal to or less than the voltage of the battery 312), the first comparator 340 may be configured to turn the switch 342 off to decouple the gate of the first protective FET 314 from the equipotential and thereby release control of the first protective FET 314 back to the fuel gauge and protection circuit controller 320.

In some examples, the ideal diode circuit 330 may prevent the override circuit 332 from drawing current from the gate of the first protective FET 314. For example, when the system voltage VPOS is greater than the voltage of the battery 314 due to a charger (e.g., the first charger 110) attempting to charge the battery 312, the device 100 may provide a disable signal DSB to the second comparator 350 of the disable circuit 334. The second comparator 350 may compare the disable signal DSB to a threshold and based on the comparison, prevent the first comparator 340 from turning the switch 342 on via the logic gate 348.

The ideal diode circuit 330 provides the functions of an ideal diode for the battery 312 without the use of additional FETs by using the first and second protective FETs 314, 316 that may be found in protective circuits of a battery system. Further, the ideal diode circuit 330 does not add any additional voltage drops to the battery and protective circuit 310 due to a standard diode or an ideal diode implemented with additional FETs to the discharge path of the battery 312. The ideal diode circuit 330 may also provide the benefits of preventing the battery 312 from being charged by a second battery (e.g., the second battery 122) due to drawing current away from the gate of the first protective FET 314 when the system voltage VPOS is greater than the voltage of the battery 312. Further, the override circuit 332 only draws current away from the gate of the first protective FET 314, thereby turning the first protective FET 314 off, and cannot force current to flow to the gate of first protective FET 314. This prevents the override circuit 332 from circumventing the over-charge protection features of the fuel gauge and protection circuit controller 320 and the first protective FET 314 by turning the first protective FET 314 on.

Figure 4:
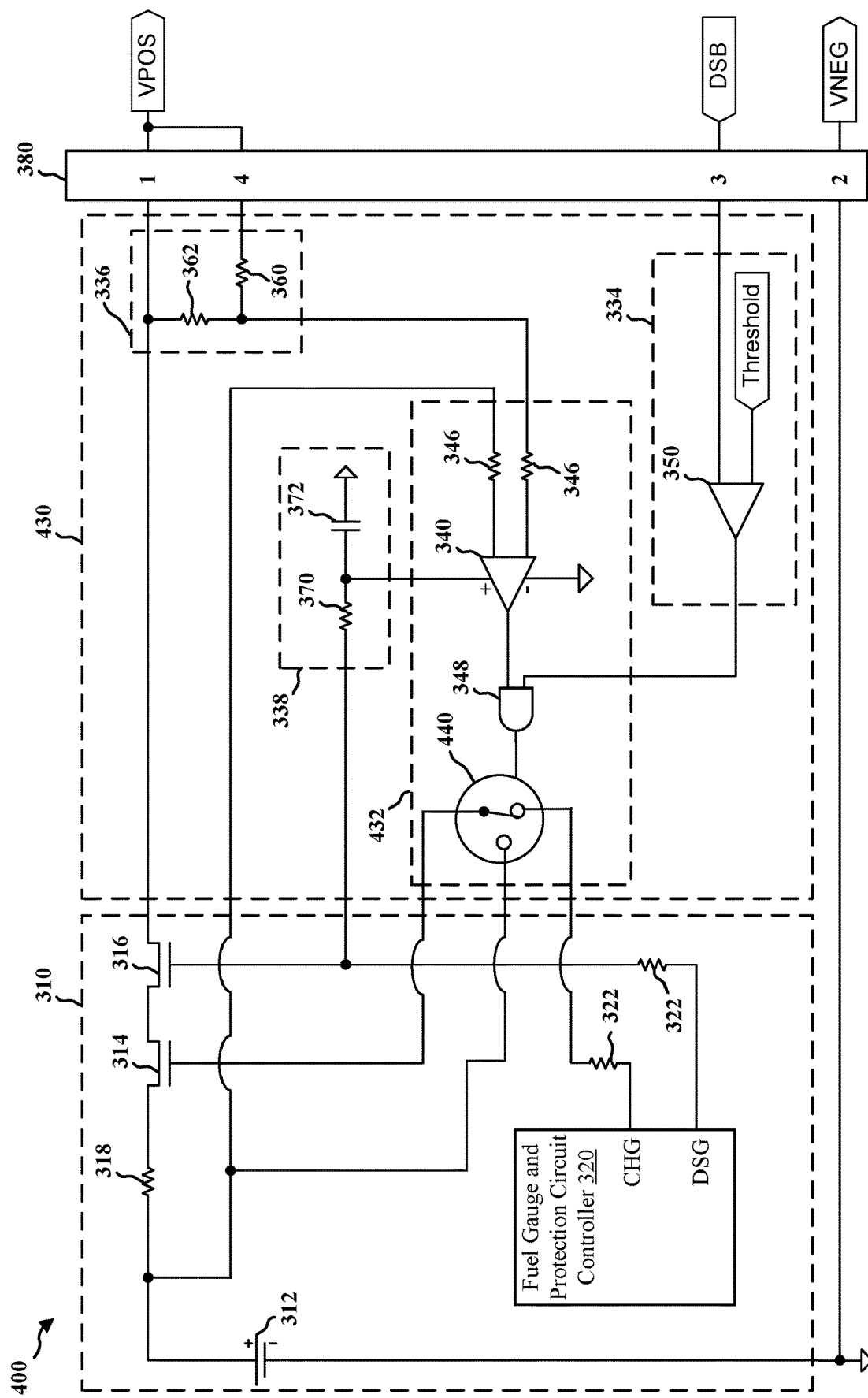
FIG. 4 is a block diagram of a second implementation of a battery system according to various implementations of the present disclosure.

FIG. 4 is a block diagram of a battery subsystem 400 which is a second implementation of a battery subsystem according to an implementation of the present disclosure. An example of the battery subsystem 400 may include the first battery 112 and the first protection circuit 114 or the second battery 122 and the second protection circuit 124 of FIG. 1. The battery subsystem 400 of FIG. 4 may include the battery and protective circuit 310 coupled with an ideal diode circuit 430. As the battery and protective circuit 310 and the ideal diode circuit 430 include components that were previously describe above, description of these components is omitted for brevity.

In this implementation, the ideal diode circuit 430 may include the disable circuit 334, the input circuit 336, and the stability circuit 338, as described above. The ideal diode circuit 430 may also include the override circuit 432 having the first comparator 340, the resistors 346, and the logic gate 348, as previously described. The override circuit 432 may also include a switch 440, which is configured to selectively toggle the coupling of the gate of the first protective FET 314 between the charge control line CHG of the fuel gauge and protection circuit controller 320 and an equipotential (e.g., the positive side of the battery 312). For example, when the first comparator 340 determines the system voltage VPOS is greater than the voltage of the battery 312, the first comparator 340 may signal the switch 440 to couple the gate of first protective FET 314 with the equipotential, otherwise the switch 440 may be configured to couple the gate of the first protective FET 314 with the charge control line CHG.

In comparison with the battery subsystem 300, the battery subsystem 400 of FIG. 4 interrupts the coupling between the charge control line CHG and the gate of the first protective switch 314 instead of drawing current away from the charge control line CHG and the gate of the first protective switch 314, as performed by the override circuit 332 of FIG. 3. In other words, the override circuit 432 may prevent the first protective FET 314 from being enabled by blocking the current from the charge control line CHG of the fuel gauge and protection circuit controller 320 to the first protective FET 314. While the second implementation provides the same protective features of the first implementation, the override circuit 432 may introduce a more complex switch (e.g., switch 440 provides two complementary connection paths while switch 342 provides only one path which can be opened) and circuitry to the battery system and therefore require a greater amount of circuit board space as compared to the override circuit 330 of FIG. 3

Figure 5:
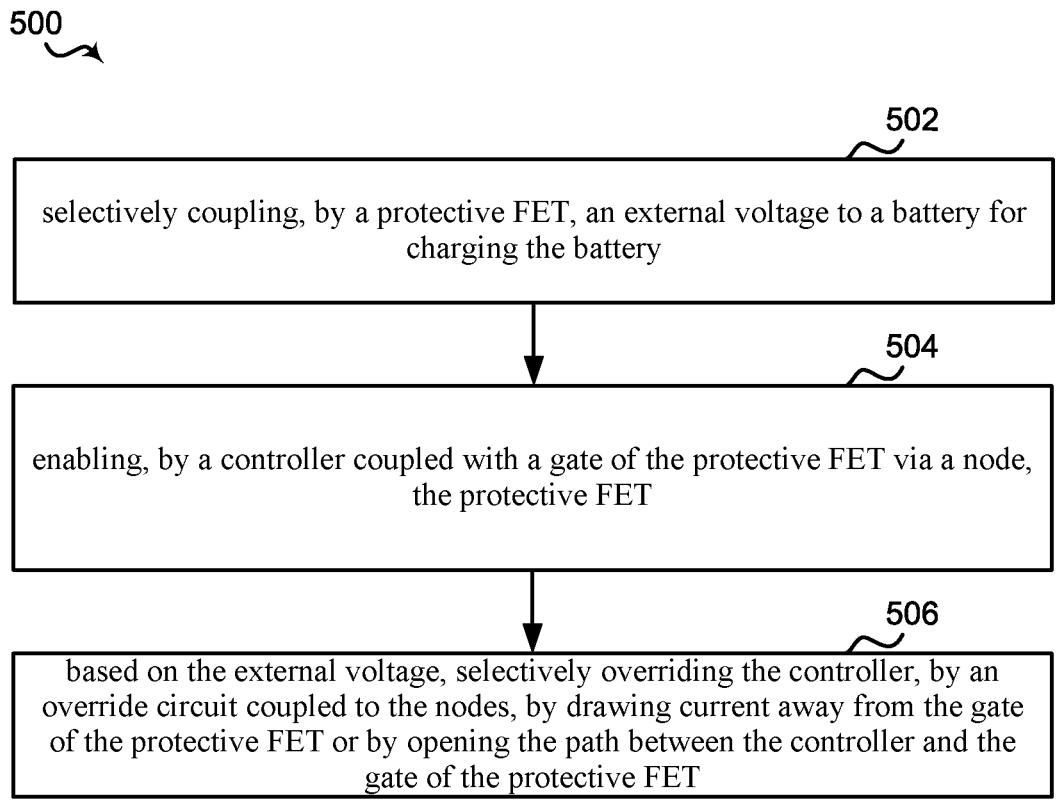
FIG. 5 is a flowchart of a first method performed by the battery system of FIGS. 1-4.

FIG. 5 is a flowchart of a first method 500 performed by the battery system of FIGS. 1-4. The method of FIG. 5 may be performed by any device, such as device 100, with multiple batteries. In an aspect, the first method 500 provides an ideal diode function to a battery 312 having a protective FET (e.g., first protective FET 314).

At 502, the device may include a protective FET 314 configured to selectively couple an external voltage to a battery for charging the battery. For example, as shown by FIGS. 3 and 4, the device may include the protective FET 314, which selectively couples the system voltage VPOS to the battery 315 for charging the battery 315.

At 504, the device may include a controller coupled with a gate of the protective FET via a node. The controller may be configured to enable the protective FET. For example, as shown by FIGS. 3 and 4, the fuel gauge and protection circuit controller 320 may include a charge control line CHG coupled to the gate of the first protective FET 314. The fuel gauge and protection circuit controller 320 may be configured to drive a current of the gate of the first protective FET 314 high such that the first protective FET 314 is enabled.

At 506, the device may include an override circuit configured to selectively override the controller by drawing current away from, or blocking current to, the gate of the protective FET based on the external voltage. For example, as shown by FIG. 3, the override circuit 332 may include the first comparator 340 and the switch 342. The switch 342 may couple the gate of the first protective FET 314 to an equipotential, thereby drawing current from charge control line CHG of the fuel gauge and protection circuit controller 320. In some examples, as shown by FIG. 4, the override circuit 432 may include the first comparator 340 and the switch 440. The switch 440 may toggle the coupling of the gate of the first protective FET 314 between the charge control line CHG and an equipotential. When the gate of the first protective FET 314 is coupled with an equipotential, the connection from the charge control line CHG of the fuel gauge and protection circuit controller 320 is blocked because the circuit path between the charge control line CHG and the gate of the first protective FET 314 is open.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus comprising:
   a protective field effect transistor (FET) configured to selectively couple an external voltage to a battery for charging the battery;
   a controller coupled with a gate of the protective FET at a node and configured to enable the protective FET by providing a current to the gate of the protective FET via the node; and
   an override circuit coupled to the node and configured to selectively override the controller, the override circuit comprising:
      a first comparator configured to:
         receive the external voltage and a voltage of the battery;
         compare the external voltage and the voltage of the battery; and
         draw current away from or blocking current to the gate of the protective FET when the external voltage is greater than the voltage of the battery; and
      a switch directly coupled with the node and an output of the first comparator and configured to selectively disable the current from being drawn by the protective FET by drawing the current at the node away from the gate of the protective FET or blocking the current at the node from being received at the gate of the protective FET based on the external voltage.

2. The apparatus of claim 1, wherein the switch is configured to selectively couple the node to an equipotential when the external voltage is greater than the voltage of the battery.

3. The apparatus of claim 2, wherein the override circuit further comprises a diode coupled between the node and the first switch and configured to conduct current from the gate of the protective FET to the equipotential.

4. The apparatus of claim 1, further comprising an input circuit comprising a primary resistor and a secondary resistor both configured to provide the external voltage to the first comparator, wherein a resistance of the primary resistor is less than a resistance of the secondary resistor.

5. The apparatus of claim 1, wherein the override circuit further comprises:
   a switch configured to selectively toggle a coupling of the node to an equipotential,
   wherein the switch couples the node to the equipotential when the external voltage is greater than the voltage of the battery.

6. The apparatus of claim 1, wherein the override circuit further comprises:
   a switch configured to selectively toggle a coupling of the gate of the protective FET between the controller and an equipotential,
   wherein the switch couples the gate of the protective FET to the equipotential when the external voltage is greater than the voltage of the battery.

7. The apparatus of claim 1, further comprising a disable circuit configured to selectively disable the override circuit based on a system signal.

8. The apparatus of claim 7, wherein the disable circuit comprises a comparator configured to:
receive the system signal and a threshold signal;
compare the system signal with the threshold signal; and
selectively disable the override circuit based on the system signal being compared with the threshold signal.

9. A method of providing an ideal diode function to a battery having a protective field effect transistor (FET), the method comprising:
selectively coupling, by the protective FET, an external voltage to the battery for charging the battery;
enabling, by a controller coupled with a gate of the protective FET at a node, the protective FET by providing a current to the gate of the protective FET via the node; and
selectively overriding, by an override circuit coupled to the node, the controller by drawing the current at the node away from the gate of the protective FET or blocking the current at the node from being received at the gate of the protective FET based on the external voltage; and
receiving, by a first comparator, the external voltage and a voltage of the battery;
comparing, by the first comparator, the external voltage and the voltage of the battery; and
by the override circuit and using a switch directly coupled with the node and an output of the first comparator, drawing current away from or blocking current to the gate of the protective FET when the external voltage is greater than the voltage of the battery.

10. The method of claim 9, further comprising selectively coupling, by a switch coupled with the node and an output of the first comparator, the node to ground when the external voltage is greater than the voltage of the battery.

11. The method of claim 10, further comprising conducting, by a diode coupled between the node and the switch, current from the gate of the protective FET to the ground.

12. The method of claim 9, further comprising:
selectively toggling, by a switch, a coupling between the node and an equipotential,
wherein the switch couples the node to the equipotential when the external voltage is greater than the voltage of the battery.

13. The method of claim 9, further comprising:
selectively toggling, by a switch, a coupling of the gate of the protective FET between the controller and an equipotential,
wherein the switch couples the gate of the protective FET to the equipotential when the external voltage is greater than the voltage of the battery.

14. The method of claim 9, further comprising selectively disabling, by a disable circuit coupled with the override circuit, the override circuit based on a system signal.

15. The method of claim 14, further comprising:
receiving, by a comparator, the system signal and a threshold signal;
comparing, by the comparator, the system signal with the threshold signal; and
selectively disabling the override circuit based on the comparing of the system signal with the threshold signal.

16. An apparatus comprising:
a protective field effect transistor (FET) configured to selectively connect an external voltage to a battery for charging the battery;
a controller having a charge line coupled with a gate of the protective FET and configured to enable the protective FET;
a switch coupled between the charge line of the controller and the gate of the protective FET; and
a first comparator having an output coupled to the switch and configured to toggle the switch to draw current away from or block current to the gate of the protective FET when the external voltage is greater than a voltage of the battery.

17. The apparatus of claim 16, wherein the first comparator is further configured to:
receive the external voltage and the voltage of the battery;
compare the external voltage and the voltage of the battery; and
determine to toggle the switch based the external voltage being greater than the voltage of the battery.

18. The apparatus of claim 16, further comprising a disable circuit configured to selectively disable the output from the first comparator based on a system signal.

* * * * *